United States Patent [19]

Bruccoleri et al.

[11] Patent Number: 5,736,880
[45] Date of Patent: Apr. 7, 1998

[54] DIFFERENTIAL CHARGE PUMP USING SURTCHINGLY CONTROLLED CURRENT GENERATORS

[75] Inventors: Melchiorre Bruccoleri, Genova; Gaetano Cosentino, Catania; Marco Demicheli, Binago; Giuseppe Patti, Favara, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 576,882

[22] Filed: Dec. 21, 1995

[30] Foreign Application Priority Data

Dec. 23, 1994 [EP] European Pat. Off. ............ 94830586

[51] Int. Cl.$^6$ .................................................. H03L 7/06
[52] U.S. Cl. .......................... 327/157; 327/536; 363/60
[58] Field of Search ........................ 357/536, 157, 357/148, 52, 53, 54, 563; 363/59, 60; 331/8, 10, 14, 17; 307/109, 110

[56] References Cited

U.S. PATENT DOCUMENTS

| | | | |
|---|---|---|---|
| 4,636,748 | 1/1987 | Latham, II | 331/17 |
| 4,959,618 | 9/1990 | Shier | 327/157 |
| 5,121,085 | 6/1992 | Brown | 331/8 |
| 5,416,691 | 5/1995 | Croughwell | 363/60 |
| 5,422,529 | 6/1995 | Lee | 327/536 |

OTHER PUBLICATIONS

IEEE Journal of Solid–State Circuits, vol. 29, No. 3, Mar. 1994 New York US, pp. 185–192, Barry Thompson et al. "A 300–MHZ BiCMOS Serial Data Transceiver".

Proceeding of the Custom Integrated Circuits Conference, Boston, May 3–6, 1992, No. Conf. 14, 3 May 1992 Institute of Electrical and Electronics Engineers, pp. 29.6.1–29.6.5, XP 000340984 Thompson B L et al. "A BICMOS Receive/Transmit PLL Pair for Serial Data Communication".

IBM Technical Disclosure Bulletin, vol. 22, No. 8A, Jan. 1980 New York US, pp. 3122–3123, O. R. Buhler et al "Charge Pump for Oscillator Control".

IBM Technical Disclosure Bulletin, vol. 33, No. 9, Feb. 1991 New York US, pp. 332–333, XP 0001009567 "Differential Charge Pump".

*Primary Examiner*—Timothy P. Callahan
*Assistant Examiner*—Kenneth B. Wells
*Attorney, Agent, or Firm*—Wolf, Greenfield & Sacks, P.C.; James H. Morris

[57] ABSTRACT

A differential charge pump circuit employing a lowpass filter network which is chargeable and dischargeable by switchingly controlled current generators. The differential charge pump employs two identical current generators for injecting the same current I in a substantially continuous manner, on the two significant nodes of the lowpass filter. The differential charge pump also employs two pairs of identical, switchingly controlled current generators connected to the two significant nodes, respectively, each capable of pulling a current I. The two generators forming each of the two pairs of switchingly controlled current generators are controlled by one of a pair of control signals (UP, DOWN) and by the inverted signal of the other of the pair of control signals, respectively. All four switchingly controlled generators may be of the same type (N-type), thus ensuring high speed and precision. The two identical (P-type) current generators employed for continuously injecting the same current I on the two nodes of the lowpass filter may be controlled through a common mode feedback loop for enhanced precision.

7 Claims, 5 Drawing Sheets

DIFFERENTIAL CHARGE PUMP USING SURTCHINGLY CONTROLLED CURRENT GENERATORS

BACKGROUND OF THE INVENTION

1. Field of the Invention

The present invention relates to a charge pump circuit having a differential structure that is suitable for applications that require high speed and immunity from common mode disturbances. The circuit is particularly well suited for implementing digital phase-locked loops (DPLL).

2. Discussion of the Related Art

The use of charge pump circuits is necessary in many applications. Basically these circuits are capable of generating an output voltage, the magnitude of which is established by the state of charge of a lowpass RC circuit, which is adjusted by charging or discharging the capacitance of the lowpass circuit by means of switchingly controlled current generators.

An important application requiring particularly high performance in terms of speed and of immunity from disturbances of the charge pump circuit is represented by the so-called phase-locked control loop, wherein the phase comparator is advantageously of the digital type. A typical schematic diagram of a DPLL (Digital Phase-Locked Loop) is shown in FIG. 1. The phase comparator (Digital Phase Detector) may be illustrated as shown in FIG. 2. The control signals (UP and DOWN) are used for driving a charge pump circuit whose current output fixes an output voltage (V_out) at the output node of a lowpass filter. The output voltage ($V_{13}$out) drives the input of a VCO (Voltage Controlled Oscillator), the input node of which may be considered as having an infinite impedance.

The charge pump circuit may be realized in a differential manner in order to provide an intrinsic rejection capacity of common mode disturbances. Such a differential charge pump circuit may be represented in principle as depicted in FIG. 3.

The lowpass filter that may be charged and discharged through the current generators controlled by the UP and DOWN signals, may be depicted by an RC network, composed of R1, C1 and C2. A typical example of a P-type and an N-type current generator is depicted in FIGS. 4 and 5, respectively. The operation of a switched P-type current generator having a circuit like the one shown in FIG. 4 is the following.

Assuming the control signal DOWN=5V and its inverted signal DOWNB=0V, the transistor M1 will be ON while transistor M2 will be OFF. In this case, the current I1 turns on the diode QA and causes a voltage drop on the resistance R1, thus directly biasing the transistor QB. Therefore, a current mirror composed of QA, R1, QB and R2 is formed and an output current $Iout_{13}P$=I1 is obtained.

When the control signal changes state, DOWN=0V and its inverted signal DOWNB=5V, the transistor M1 will be OFF and M2 will be ON. Consequently, the current I1 flows through the MOS transistor M2, thus causing a voltage drop on R2. The transistor QA will be OFF and the base voltage of the transistor QB will be almost equal to the supply voltage Vdd. In this way, the emitter of QB will be biased at Vdd-R2I1, while its base is at about Vdd. Therefore the transistor QB will be OFF and the output current will be null (Iout_P=0).

A switched N-type current generator as the one depicted in FIG. 5 functions in a similar manner. For UP=5V and UPB=0V, M3 will be ON and M4 will be OFF. I2 will flow through the MOS transistor M3 and in a manner similar to that described for the circuit of FIG. 4, an output current given by Iout_N=I2 will be obtained.

In the reverse condition, that is when UP=0V and UPB=5V, M3 will be OFF and M4 will be ON. I2 will flow through M4 thus causing a voltage drop given by R4I2 which reverse biases the transistor QD and therefore the output current will be null (Iout_N=0).

This type of a charge pump circuit architecture has several drawbacks when implemented in an integrated form according to common fabrication processes of integrated circuits. A first problem is tied to the difficulty of implementing switched P-type current-generators having a high switching speed from the ON state to the OFF state and from the OFF state to the ON state. In the case of widely used fabrication processes for integrating signal processing systems, as for example the so-called mixed technology processes (BiCMOS), it is highly desirable to avoid the integration of vertical PNP structures for general compatibility reasons of the fabrication process. In these cases, the required P-type current mirrors (current generators) are instead made by employing P-channel MOSFET transistors, and this tends to further depress the switching speed characteristics of these controlled generators.

A second problem is tied to the difficulty of implementing P-type and N-type switched current generators having similar switching characteristics. The noncoincidence of the switching characteristics of P-type and N-type control current generators forming the charge pump circuit introduces imprecisions in the common mode voltage of the lowpass filter, because a P-type generator will tend to turn off and/or to turn on in a longer period of time than will a complementary N-type current generator. Moreover, because the P-type and N-type current generators are circuitally different from one another, they exhibit different behavior upon a variation of the process "spread" and of the temperature, phenomena that tend to enhance the imprecision of the circuit.

SUMMARY OF THE INVENTION

It is an object of the present invention to provide a differential charge pump circuit designed to eliminate almost completely the above-noted drawbacks and disadvantages.

The differential charge pump circuit according to an illustrative embodiment of the present invention exploits a first pair of identical current generators of a substantially nonswitched type to constantly inject the same current I on the two significant (input and output) nodes of a lowpass filter. The same current I is pulled out of the same nodes of the lowpass filter by at least two pairs of identical, switchingly controlled current generators, each pair being functionally connected to one of the two significant nodes of the lowpass filter. The respective switchingly controlled current generators are controlled by a first signal of a pair of control signals and by the inverted form of the other signal of the pair of control signals.

All four switchingly controlled identical current generators of said two pairs are advantageously of the same type, for example of the N-type, and have an identical circuit. Therefore, they present substantially the same switching characteristics and the same behavior to the variation of the process "spread" and of temperature. This ensures a minimization of common mode errors, because the switching times from the ON state to the OFF state and from the OFF state to the ON state are intrinsically identical. Moreover, all the controlled generators may be of the N-type and therefore capable of ensuring the maximum switching speed.

Preferably, the two identical P-type current generators that uninterruptly inject the same current on the two significant nodes of the lowpass filter are controlled by a signal generated by a feedback loop to prevent the occurrence of common mode voltage variations in the absence of a commanded correction implemented by the switching of the control phases UP and DOWN.

BRIEF DESCRIPTION OF THE DRAWINGS

The different aspects and advantages of a preferred, non-limiting embodiment of the present invention will be described by way of example with reference to the accompanying drawings, in which.

DETAILED DESCRIPTION

Figure 6:
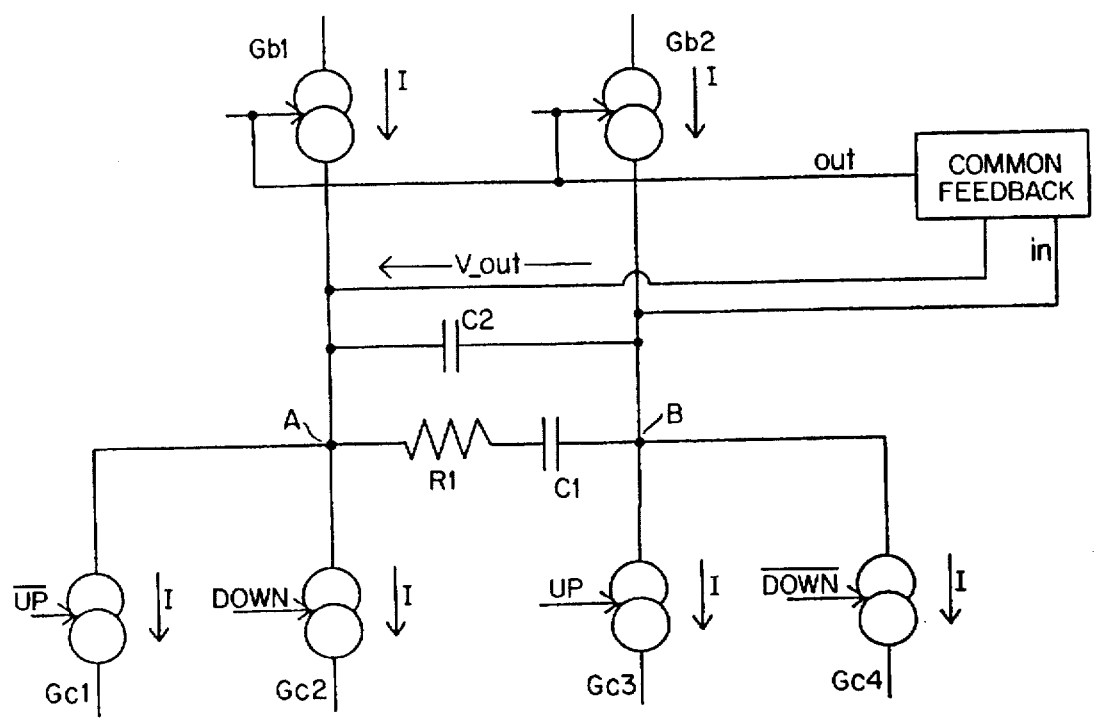
FIG. 6 is a basic diagram of a differential charge pump circuit of the present invention.

FIG. 6 illustrates a differential charge pump circuit according to an embodiment of the present invention. The circuit includes the RC circuit formed by R1, C1 and C2, and is implemented by employing two identical current generators Gb1 and Gb2, for example of a P-type, capable of injecting a current I, in a substantially uninterrupted way, on the two significant nodes A and B of the RC low pass filter. Two pairs of identical, switchingly controlled current generators, respectively Gc1, Gc2 and Gc3, Gc4, depending on their state,—determine the absorption from the same nodes A and B of the lowpass filter (R1, C1, C2) of a current I, essentially identical to the current I that is injected on the same nodes by the current generators Gb1 and Gb2.

Of course, all four switchingly controlled current generators Gc1 ... Gc4, are of the same type, for example of the N-type, and have an identical circuit structure. Each pair of switchingly controlled generators is controlled by the non-inverted signal and by the inverted signal of a pair of control phases, namely UP and DOWN, UP, DOWN\, respectively (for example UP\, DOWN and UP, DOWN\).

The operation of the circuit is as follows. In the absence of a correction command (for example UP=0, DOWN=0) the generators Gc1 and Gc4, respectively driven by the inverted signals UP\ and DOWN\ are ON. An ON condition of the current generators Gc1 and Gc4 permits the flowing of the current I that is injected on the relative nodes A and B of the lowpass filter by the two upper current generators Gb1 and Gb2 along both "sides" of the lowpass filter network. In other words, no current flows through the lowpass filter and therefore no variation of the output voltage V_out occurs. When a correction of the output voltage V_out is commanded, one or the other signal of the pair of control phases UP and DOWN will assume a high logic state, for example UP=1, DOWN\=0. Therefore a current I will flow through the lowpass filter network, thus modifying the output voltage V_out until a correct value thereof is reached and the pair of control signals will again assume the same logic state, for example: UP=1, DOWN=1.

Figure 1:
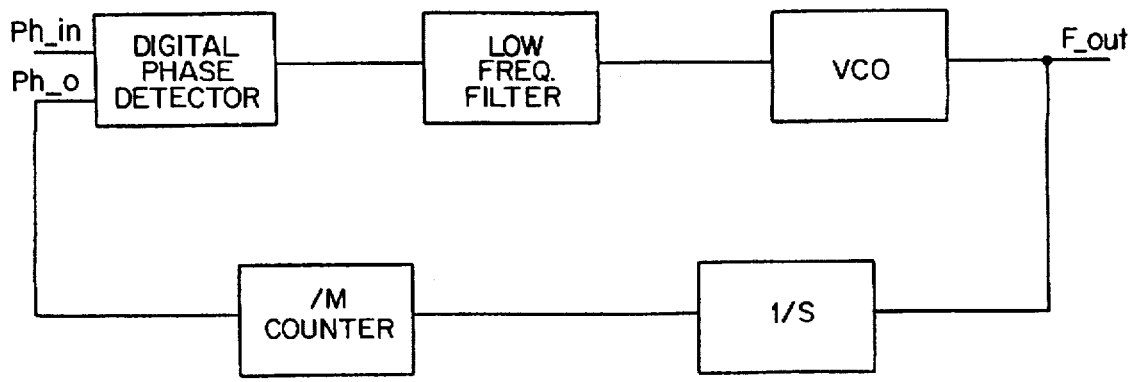
FIG. 1 is a block diagram of a digital phase-locked loop circuit.
Figure 2:
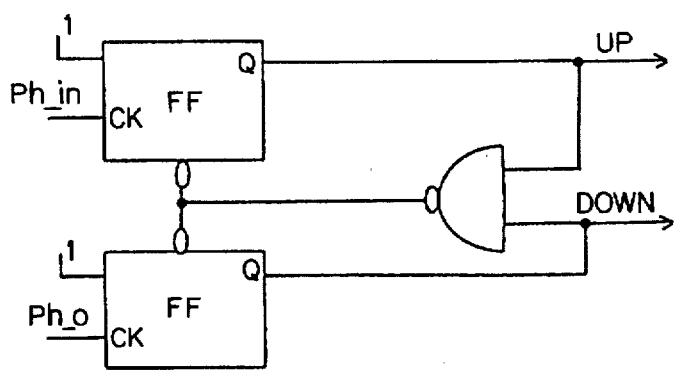
FIG. 2 is a basic diagram of a digital type phase detector usable in the digital phase-locked loop circuit of FIG. 1.
Figure 3:
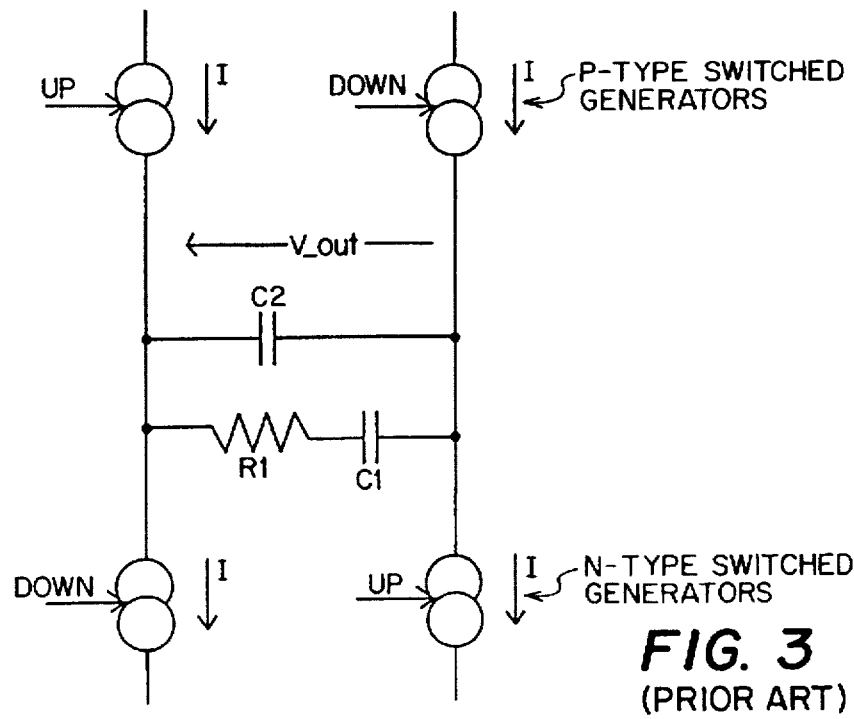
FIG. 3 is a basic circuit diagram of a differential charge pump circuit.
Figure 5:
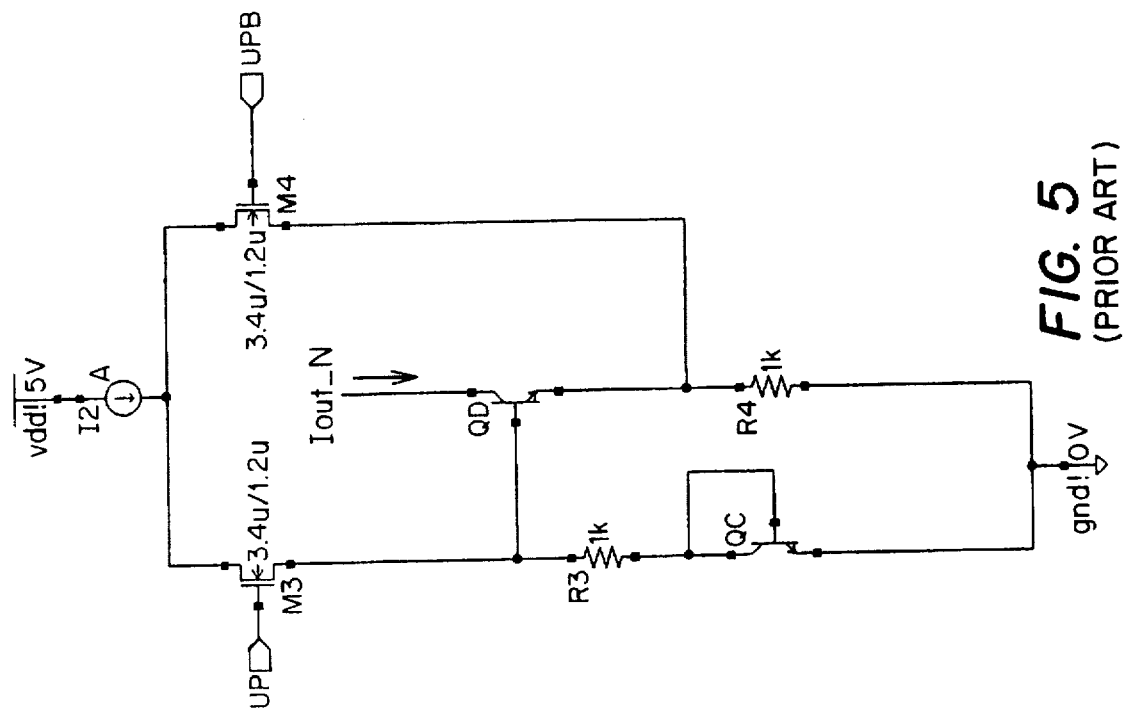
FIG. 5 is a circuit diagram of an N-type switched current generator; invention.
Figure 4:
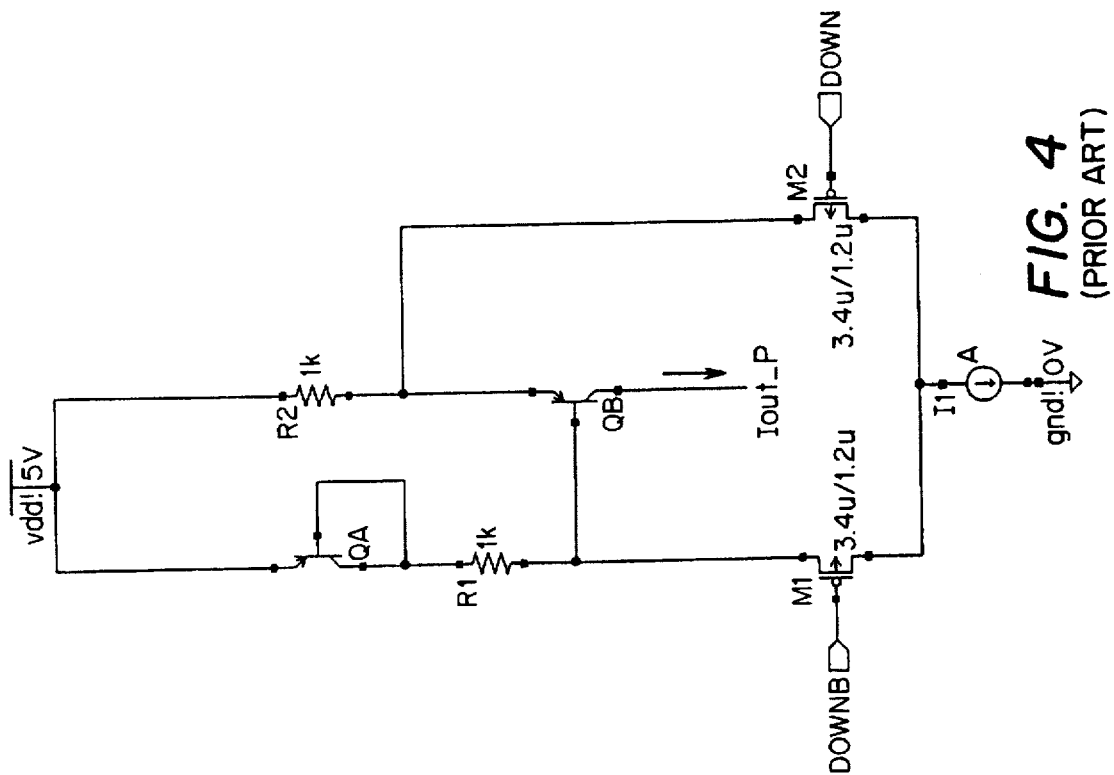
FIG. 4 is a circuit diagram of a P-type switched current generator.

In a type of application as that of a DPLL circuit of FIGS. 1 and 2, the digital phase comparator will generate successively a reset signal which will turn on the current generators Gc1 and Gc4, that are driven by the inverted signal UP\ and DOWN\, and disable the other two generators Gc2 and Gc3 by returning both signals to a low logic state (UP=0, DOWN=0).

Of course, the driving of the four switchingly controlled current generators may also be arranged differently from the manner described above.

Figure 7:
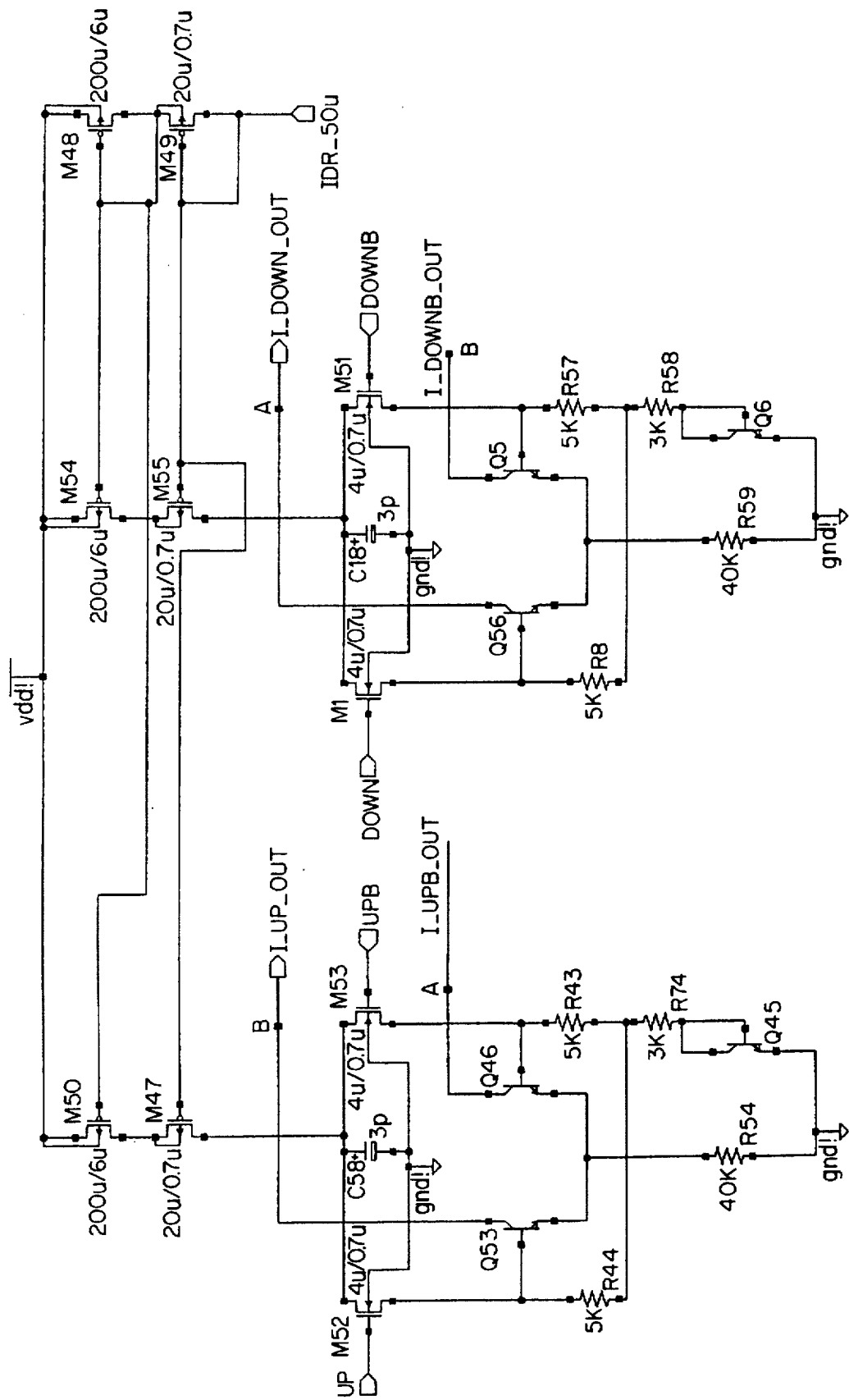
FIG. 7 is an embodiment of a differential charge pump circuit of the present invention.

A preferred embodiment of the two pairs of switchingly controlled current generators Gc1, Gc2, Gc3 and Gc4 is shown in FIG. 7. The transistors M50, M54 and M48 form a current mirror, which is preferably cascoded by the use of transistors M47, M55 and M49, for biasing the circuit. The connection terminals to the nodes A and B of a lowpass filter (re: FIG. 6) are indicated by the respective letters in the figure. Similarly labels indicate the input terminals of the complementary pairs of the two control signals: UP, UPB and DOWN, DOWNB, respectively. The circuit shown has been designed for a bias current level of 50 µA delivered through the drain of the transistors M47 and M55.

Considering the circuit "module" on the left-side of FIG. 7, the functioning of the circuit may be described as follows. Assuming the signal UP is high and therefore its inverse, UPB is low, the current flows along the path comprising M52, R44, R74 and Q45 (diode configured). As a consequence, Q53 is ON. Since M53 and therefore Q46 are OFF, the current through R43 may be considered null and the circuit as a whole implements a current mirror which, for the resistance values used, has a 5:1 ratio.

In fact, the current subdivision which occurs between the above noted path or branch of the mirror and the branch constituted by Q53 and R54 is determined by the impedance of the respective current paths which for the first path or branch is equal to 8K_plus the on-resistance of a transistor of five units of area (Q45), while for the other path or branch is equal to 40K_plus the on-resistance of a transistor of unit area 1 (Q53). Therefore, the circuit pulls a current of 10µA through the terminal I_UP_OUT, which is connected to the B node of the lowpass filter.

An inversion of the values of the signals UP and UPB produces an absorption of 10µA through the terminal I_UPB_OUT, which is connected to the A node of the lowpass filter. A similar function is performed in the other circuit "module" shown in the right-hand portion of FIG. 7, which is identical to the above described left hand module.

The capacitors C58 and C18 have the function of stabilizing the drain voltage of the respective MOS transistors M47 and M55 at the switching instants of the control signals UP and DOWN.

The upper current generators Gb1 and Gb2 of the basic scheme of the charge pump circuit of the invention depicted in FIG. 6, may be clearly realized in various forms as will be evident to a skilled person, in view of the fact that they are not switchingly controlled generators and therefore they have no particular speed requirements. On the other hand, it may be preferable to employ current generators controlled by a common mode feedback loop in order to ensure the injection of an essentially identical current to the nodes A and B of the lowpass filter.

Figure 8:
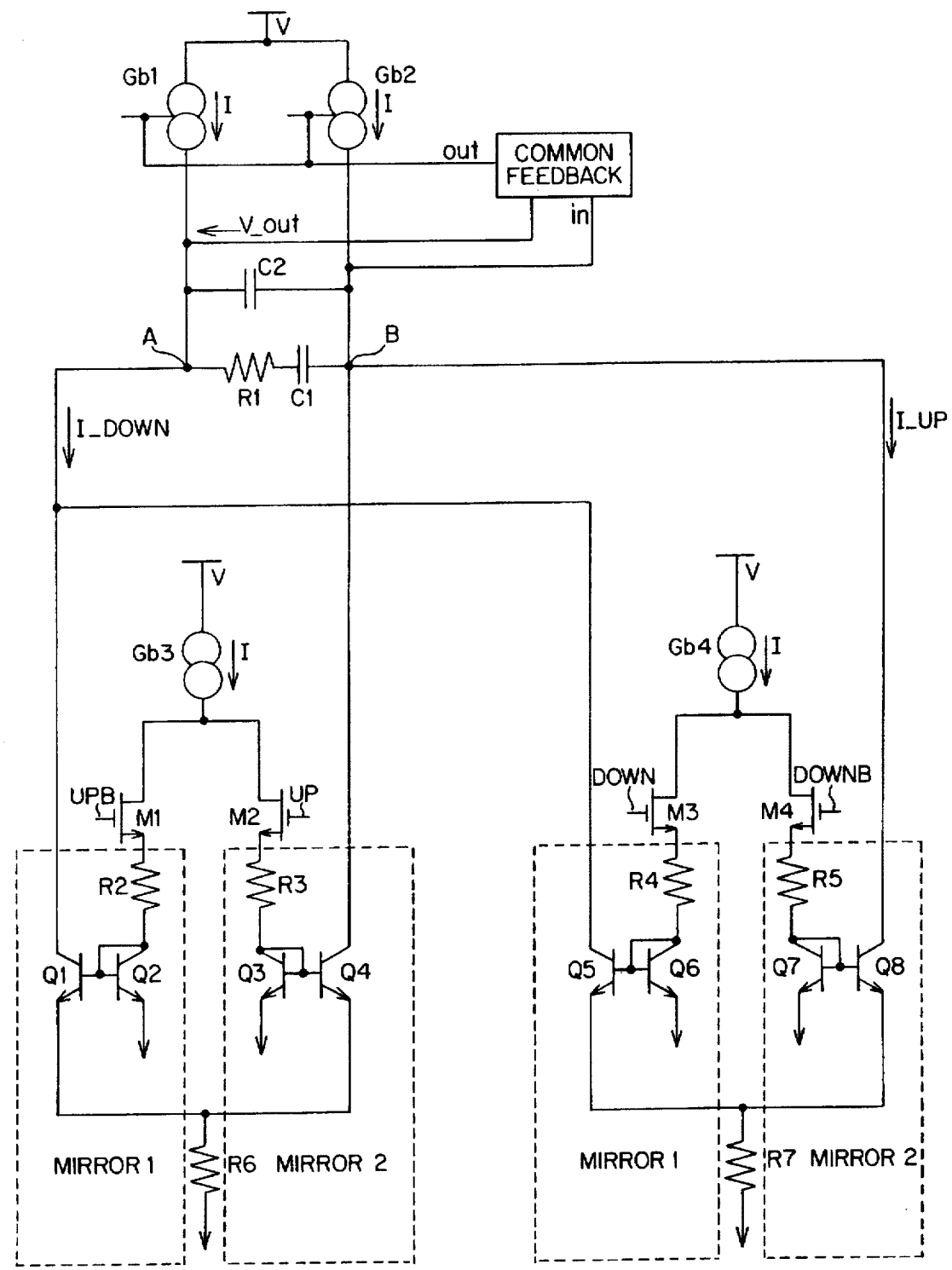
FIG. 8 is a second embodiment of a differential charge pump circuit of the present invention that is particularly well suited for use in CMOS circuits.

A second embodiment of the differential charge pump circuit that is particularly well suited for use in CMOS circuits is illustrated in FIG. 8. In FIG. 8, circuit elements Gb1, Gb2, R1, R2, C2, operate as already described with respect to FIG. 6. Considering the left hand portion of the circuit, its operation is as follows. When the control signal UP is high and therefore its inverse UPB is low, the current I from Gb3 flows along the path M2, R3, and Q3 (diode configured). Transistor Q4 acts as a current mirror and pulls current from node B, effectively increasing the output voltage V_out. Because UPB is low, transistor M1 is OFF and therefore so are transistors Q1 and Q2. When instead the control signal UPB is high and its inverse UP is low, the situation is the reverse, and current from Gb3 flows along the path M1, R2, and Q2 (diode configured). In this case, transistor Q1 acts as a current mirror and pulls current from node A, effectively decreasing the output voltage V_out. The current generators Gb3 and Gb4 in FIG. 8 may be realized as shown in FIG. 7 with respect to transistors M50 and M47, M54 and M55, and M48 and M49, or otherwise. The operation of the right hand portion of the circuit is similar to that already described, only with respect to the control signals DOWN and DOWNB.

In FIG. 8, transistors M1–M4 are preferably NMOS transistors. The use of NMOS transistors reduces transients in the current mirrors because the charge injection which they provide is in a direction that decreases transient duration. Additionally, the resistances R2–R5 that are located between the NMOS transistors and the diode configured BJT (Q2, Q3 and Q6, Q7) prevent the NMOS source signals (UP, UPB, DOWN, DOWNB) from "seeing" the capacitances that are associated with the integrated structures of the BJTs. This results in a decreased switching delay of the circuit. The circuit of FIG. 8 is therefore particularly well suited to overcome problems which arise when the charge pump must be driven by CMOS signals, by using CMOS phase splittings, and by using CMOS phase comparators in order to limit power dissipation. Hence, the circuit of FIG. 8 ensures good matching and a high speed of operation with other CMOS circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A differential charge pump circuit comprising:

a lowpass filter having a first node and a second node, the low pass filter including a resistor that is coupled in series with a first capacitor between the first and second nodes and a second capacitor that is coupled between the first and second nodes and is in parallel with the resistor and the first capacitor across the first and second nodes;

a first current generator coupled to the first node to inject a substantially continuous first current into the first node;

a second current generator coupled to the second node to inject a substantially continuous second current into the second node, the second current being equal to the first current;

first means, responsive to a first CMOS logic level control signal and an inverse of the first logic level CMOS control signal, for pulling current from the first and second nodes of the lowpass filter, the first means including means for switching from pulling a current equal to the first current from the first node when the first CMOS logic level control signal is deasserted to pulling a current equal to the second current from the second node when the first CMOS logic level control signal is asserted; and second means, responsive to a second CMOS logic level control signal and an inverse of the second CMOS logic level control signal, for pulling current from the first and second nodes of the lowpass filter, the second means including means for switching from pulling a current equal to the first current from the first node when the second CMOS logic level control signal is asserted to pulling a current equal to the second current from the second node when the second CMOS logic level control signal is deasserted;

wherein the means for switching included in the first means includes resistive means for insulating the first CMOS logic level control signal and the inverse of the first CMOS logic level control signal from a capacitance of the first means for pulling current.

2. A differential charge pump circuit comprising:

a lowpass filter having a first node and a second node, the low pass filter including a resistor that is coupled in series with a first capacitor between the first and second nodes and a second capacitor that is coupled between the first and second nodes and is in parallel with the resistor and the first capacitor across the first and second nodes;

a first current generator coupled to the first node to inject a substantially continuous first current into the first node;

a second current generator coupled to the second node to inject a substantially continuous second current into the second node, the second current being equal to the first current;

first means, responsive to a first CMOS logic level control signal and an inverse of the first logic level CMOS control signal, for pulling current from the first and second nodes of the lowpass filter, the first means including means for switching from pulling a current equal to the first current from the first node when the first CMOS logic level control signal is deasserted to pulling a current equal to the second current from the second node when the first CMOS logic level control signal is asserted; and second means, responsive to a second CMOS logic level control signal and an inverse of the second CMOS logic level control signal, for pulling current from the first and second nodes of the lowpass filter, the second means including means for switching from pulling a current equal to the first current from the first node when the second CMOS logic level control signal is asserted to pulling a current equal to the second current from the second node when the second CMOS logic level control signal is deasserted;

wherein the first means includes a current source that generates a continuous current, and the switching means included in the first means includes first and second current mirroring means, the first current mirroring means mirroring the continuous current generated by the current source when the first CMOS logic level control signal is deasserted, and the second current mirroring means mirroring the continuous current generated by the current source when the first CMOS logic level control signal is asserted.

3. The differential charge pump of claim 2, wherein the first and second current mirroring means each include means for reducing transients by decreasing transient duration within the first and second current mirroring means, respectively.

4. A differential charge pump circuit comprising:

a lowpass filter having a first node and a second node, the low pass filter including a resistor that is coupled in series with a first capacitor between the first and second nodes, and a second capacitor that is coupled between the first and second nodes and is in parallel with the resistor and the first capacitor across the first and second nodes;

a first current generator coupled to the first node to inject a substantially continuous first current into the first node;

a second current generator coupled to the second node to inject a substantially continuous second current into the second node, the second current being equal to the first current;

a first switchingly controlled current generator coupled to the first and second nodes, the first switchingly controlled current generator having a first current source that provides a continuous current and a pair of switchingly controlled current mirrors coupled to the first current source, a first switchingly controlled current mirror of the pair coupled to the first node and being responsive to an inverse of a first CMOS logic level control signal, and a second switchingly controlled current mirror of the pair coupled to the second node and being responsive to the first CMOS logic level control signal; and a second switchingly controlled current generator coupled to the first and second nodes, the second switchingly controlled current generator having a second current source that provides a continuous current and a pair of switchingly controlled current mirrors coupled to the second current source, a first switchingly controlled current mirror of the pair coupled to the first node and being responsive to a second CMOS logic level control signal, and a second switchingly controlled current mirror of the pair coupled to the second node and being responsive to an inverse of the second CMOS logic level control signal.

5. The differential charge pump of claim 4, wherein the first switchingly controlled current mirror includes:

a first transistor having a first terminal coupled to the first current source and having a second terminal that is a control terminal to receive the inverse of the first CMOS logic level control signal; and a bipolar current mirror coupled to a third terminal of the first transistor.

6. The differential charge pump of claim 5, wherein the first transistor is an NMOS transistor and the switchingly controlled current mirror further includes a resistor coupled between the third terminal of the first transistor and the bipolar current mirror.

7. The differential charge pump of claim 4, further comprising:

a common mode voltage feedback circuit coupled to the first and second nodes and the first and second current generators, the common mode voltage feedback circuit providing a regulation signal to the first and second current generators.